United States Patent [19]
Nakanishi et al.

[11] Patent Number: 5,097,240
[45] Date of Patent: Mar. 17, 1992

[54] MAGNETIC FIELD GENERATING DEVICE FOR ESR SYSTEM

[75] Inventors: Akio Nakanishi; Kenta Konishi; Takashi Kobayashi, all of Mishima, Japan

[73] Assignee: Sumitomo Special Metal Co., Ltd., Osaka, Japan

[21] Appl. No.: 422,751

[22] Filed: Oct. 6, 1989

[30] Foreign Application Priority Data

Jun. 16, 1989 [JP] Japan .................. 1-154875
Aug. 24, 1989 [JP] Japan .................. 1-218233

[51] Int. Cl.$^5$ .............................................. H01F 1/00
[52] U.S. Cl. ................................. 335/296; 335/298
[58] Field of Search ..................... 335/131–133, 335/296–299

[56] References Cited

U.S. PATENT DOCUMENTS

| | | | |
|---|---|---|---|
| 3,223,897 | 12/1965 | Sullivan | 335/182 |
| 4,093,912 | 6/1978 | Double et al. | 335/287 |
| 4,636,756 | 1/1987 | Ito et al. | 335/202 |

Primary Examiner—Leo P. Picard
Assistant Examiner—Lincoln Donavan
Attorney, Agent, or Firm—Watson, Cole, Grindle & Watson

[57] ABSTRACT

In a magnetic field generating device for an ESR system in which a pair of permanent magnets are respectively attached to opposing surfaces of a pair of stationary yokes arranged in opposite and spaced apart relationship with each other and a continuously varying magnetic field is caused to generate in a space between the opposing permanent magnets, a plurality of movable yokes for continuously changing the distance between the stationary yokes are arranged to at least one of the pair of stationary yokes so that they are moved individually thereby enabling the magnetic resistance of a magnetic path formed by the permanent magnets, stationary yokes and movable yokes to vary continuously. The device of this invention can vary the magnetic field intensity continuously and finely at high accuracy and can be used at a reduced cost and size with improved operationability in ESR system.

29 Claims, 7 Drawing Sheets

DC CURRENT APPLIED TO SOLENOID COIL

MAGNETIC FIELD GENERATING DEVICE FOR ESR SYSTEM

BACKGROUND OF THE INVENTION

1. Field of the Invention

The present invention concerns a magnetic field generating device for an electron spin resonance system (hereinafter referred to as "ESR system") and, more particularly, it relates to such type of magnetic field generating device that is capable of continuously varying a magnetic field between the magnetic poles of permanent magnets arranged opposite to each other leaving a desired space therebetween while the magnetic field is made to keep a high degree of uniformity.

The ESR system is generally used in the field of research and development.

Since the ESR system can detect unpaired electrons due to natural radiation damages of the test objects and measure the ages of archaeological remains, geology, minerals and fossil remains, it has also been utilized recently in the field of archaelogy and earth science.

For the magnetic field generating device forming an essential part of the ESR system, it is necessary to form a magnetic field of about 3000-4000 gausses at high accuracy and uniformity in the space in which a test object is arranged and to continuously change the intensity of the magnetic field within the range of ± about 100 gausses.

2. Description of the Prior Art

In the magnetic field generating device used for ESR system, electromagnets have usually been employed. It is easy to generate and continuously change a magnetic field in a desired space by continuously varying a current applied to the electromagnets but this involves a drawback that the entire device becomes large-sized and expensive.

Further, there has been proposed a structure using only permanent magnets as a magnetic field generating source so that the magnetic field intensity is changed by changing the opposing distance (length of the space) between the permanent magnets.

However, this structure has also had the disadvantage that when the opposing distance is changed, the degree of uniformity of the magnetic field is impaired due to various causes including the deviation of the axis of one of the opposing permanent magnets from that of the other.

The degree of uniformity of the magnetic field required in the ESR system is as high as less than 0.01% and, accordingly, there has not been known a device using a magnetic circuit comprising permanent magnets.

In view of the above, the present applicant has already proposed a magnetic field generating device for an ESR system in which a movable yoke 10 is disposed to one of a pair of stationary yokes 1a and 1b for continuously varying the distance between the opposing surfaces of the stationary yokes, thereby enabling the magnetic resistance of a magnetic path A formed by permanent magnets 3a, 3b, stationary yokes 1a and 1b, movable yoke 10 and a fixed yoke 8 (refer to Japanese Utility Model Laid-Open Hei 1-104574).

In FIG. 15, a space 2 is formed between a pair of permanent magnets 3a and 3b. Magnetic pole pieces 4a and 4b are disposed respectively to the opposing surfaces of the permanent magnets 3a and 3b.

Supports 5a, 5b and 5c are disposed for forming and maintaining a pair of stationary yokes 1a and 1b with a predetermined space and they are usually made of non-magnetic material. A gap 9 is formed between the movable yoke 10 and the fixed yoke 8.

In the constitution as described above, if the opposing distance between the movable yoke 10 and the fixed yoke 8 is made large, the magnetic resistance in the magnetic path A is increased to reduce the magnetic field intensity in the space 2. On the other hand, if the opposing distance is reduced, the magnetic resistance in the magnetic path A is decreased to increase the magnetic field intensity in the space 2.

Provision of a magnetic field generating device for an ESR system reduced in size and cost has been enabled by the proposed device. However, in the above-mentioned constitution, since the change of the magnetic field is great relative to the movement of the movable yoke, no fine change of the magnetic field can be obtained. Thus, the correspondence between the number of rotation for the movable yoke and the change of the magnetic field is not accurate, which is not sufficient for practicing the measurement of a resonance field at high accuracy and various improvements have still been required.

SUMMARY OF THE INVENTION

Accordingly, it is an object of the present invention to provide a magnetic field generating device for an ESR system having satisfactory degree of uniformity for the magnetic field intensity in the space and capable of varying the magnetic field intensity continuously and at high accuracy while maintaining a high degree of uniformity.

Another object of the present invention is to provide a small-sized and inexpensive magnetic field generating device used for an ESR system.

A further object of the present invention is to provide a magnetic field generating device for an ESR system of improved operationability.

In the present invention, permanent magnets are used as a magnetic field generating source in a magnetic field generating device for use with an ESR system, and a plurality of movable yokes are disposed to a pair of stationary yokes that forms a magnetic path for changing the distance between the opposing surfaces thereof thereby changing the magnetic resistant without varying the size of the space formed between the permanent magnets. More specifically, the foregoing object, in particular, change of the magnetic field intensity at high accuracy can be attained by a plurality of movable yokes, for example, having different amount of magnetic resistance that can be varied such that they are adjustable individually.

That is, the present invention provides a magnetic field generating device for an ESR system in which a pair of permanent magnets are respectively attached to opposing surfaces of a pair of stationary yokes arranged in opposite and spaced apart relationship with each other and a continuously varying magnetic field is caused to generate in a space between the opposing permanent magnets, wherein a plurality of movable yokes for continuously changing the distance between opposing surfaces of the stationary yokes are arranged to at least one of a pair of stationary yokes so that they are moved individually thereby enabling the magnetic resistance of a magnetic path formed by the permanent magnets, stationary yokes and movable yokes to vary continuously.

Further, the present invention also provides a magnetic field generating device for an ESR system in which movable yokes for continuously varying the distance between opposing surfaces of a pair of stationary yokes are disposed to the stationary yokes such that a pair of movable yokes are brought closer or a part with each other in symmetry with respect to a central transversal cross sectional plane between opposed surfaces of permanent magnets, that is, central plane of the space, thereby enabling the magnetic resistance formed with permanent magnets, stationary yokes and movable yokes to vary continuously.

The present invention further provides a magnetic field generating device for an ESR system as described above, in which a solenoid coil is disposed around movable yokes for stably varying the magnetic field intensity linearly in the space with improved operationability and a DC current is supplied to the solenoid coil to superimpose a weak magnetic field, for example, of about ±100 G by the solenoid coil to the space thereby making the magnetic field variable in the space.

DESCRIPTION OF THE PREFERRED EMBODIMENTS

In the present invention, the shape of the yokes to which permanent magnets are attached may be optional, for example, in the form of a square plate or the like, depending on the shape of each of permanent magnets used, magnetic characteristics, etc.

For the permanent magnets serving as a magnetic field generating source, it is desired to select known material, shape, etc., for example, magnets of rare earth group or ferritic material, depending on the required magnetic field intensity and the size of the device.

In particular, where the reduction in the size is required, it is desirable to use Fe-B-R series magnet (in which R means rare earth element mainly composed of Nd and Pr) (for example, NEOMAX, trade name: manufactured by Sumitomo Special Metals Co. Ltd.) having a high energy source.

For the permanent magnet, a plurality of block form permanent magnets may be combined and integrated depending on desired size and configuration.

Further, there may be attached a magnetic pole piece to each of the opposing surfaces of the pair of permanent magnets so as to improve the degree of uniformity of the magnetic field according to necessity.

Figure 10B:
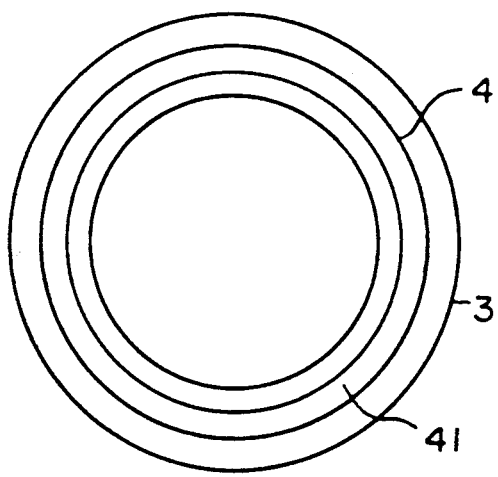
Figure 11B:
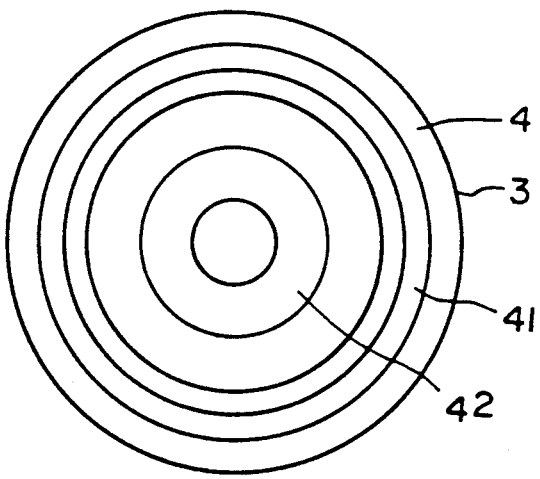
Figure 10A:
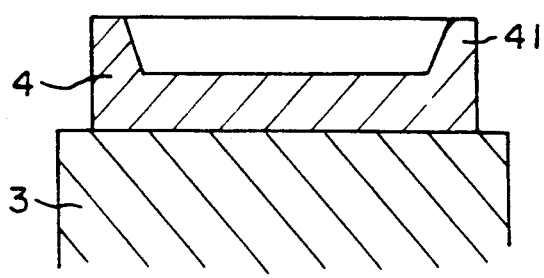
Figure 11A:
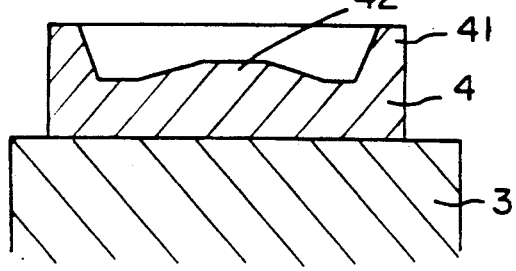

The magnetic pole piece contributes to the moderation of the scattering in the magnetic properties of the permanent magnets and effective concentration of magnetic fluxes in the space, in particular, in the case of using a plurality of block-form permanent magnets. For the constitution of the magnetic pole piece, it is desirable to dispose an annular protrusion 41 having a trapezoidal cross section at the periphery of the magnetic pole piece 4 or dispose a convexing protrusion 42 having a trapezoidal cross section at the central portion as shown in FIGS. 10 and 11. Further, there may also be employed various constitutions such as disposing a plurality of magnetic pieces for adjusting magnetic field at a required position on the opposing surfaces of the space between the magnetic pole piece 4 as required.

Figure 1:
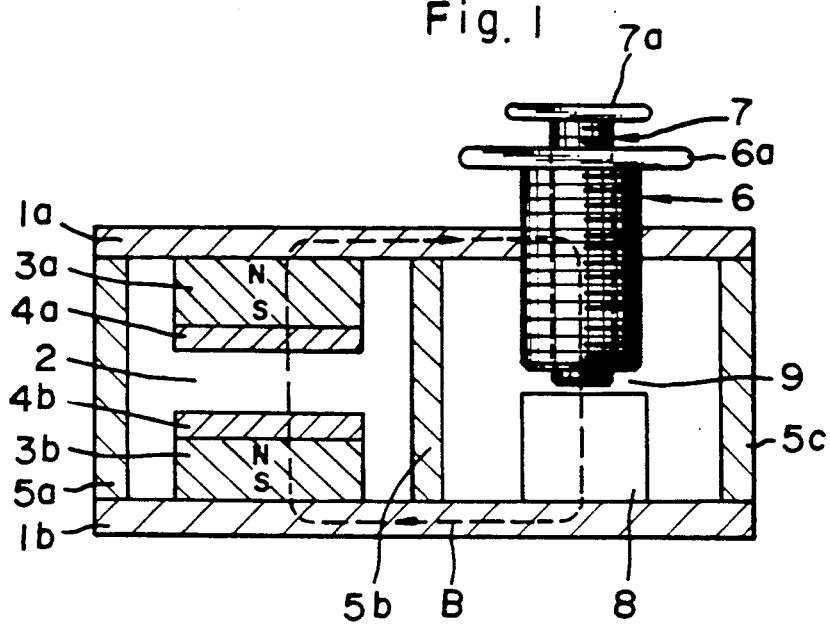
FIG. 1 is a vertical sectional view of one embodiment of a magnetic field generating device for an ESR system according to the present invention.

The movable yoke which is adapted to continuously change the magnetic resistance in the magnetic path, comprises a coarsely movable screwed bolt of large diameter of a finely movable screwed bolt of small diameter disposed coaxially as shown, for example, in FIG. 1, in which fine adjustment for the magnetic field intensity is at first made by forwarding and backwarding the coarsely movable screwed bolt followed by fine adjustment by forwarding and backwarding the finely movable screwed bolt, by which the change of a required space Bg can be moderated.

Figure 2:
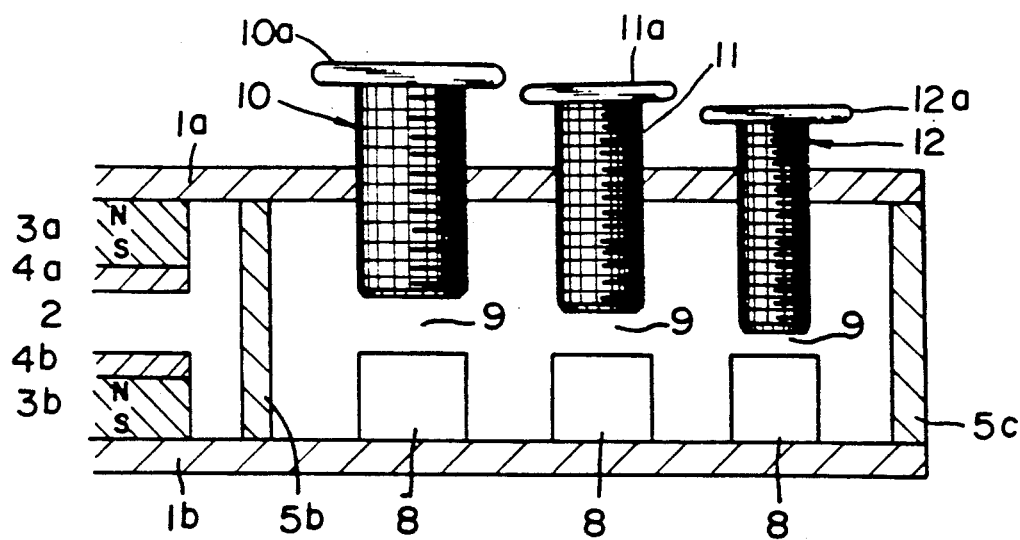
FIG. 2 is a side elevational view, partially in vertical section, of one embodiment of a magnetic field generating device for an ESR system according to the present invention.

Accordingly, a plurality of movable yokes can be disposed optionally, for example, by coaxially disposing a plurality of screwed bolts of different diameter and screw pitch as in the case of the screwed bolt shown in FIG. 1, disposing screwed bolts of identical or different diameter with identical or different screw pitch at required positions as shown in FIG. 2, etc., to a pair of stationary yokes constituting a magnetic path, so long as the distance between the opposing surfaces can be changed to vary the magnetic resistance.

Further, movable yokes can properly be arranged to stationary yokes in addition to the constitution of arranging a plurality of movable yokes of different diameter shown in examples, for example, arranging a plurality of them with different diameter in parallel or disposing a plurality of movable yokes of smaller diameter around a movable yoke of large diameter.

For forming a magnetic field which is uniform and varies over a wide range in a space between permanent magnets, it is desirable to dispose a pair of movable yokes to a pair of stationary yokes such that they are brought closer and apart from each other in symmetry with the central plane of the space.

Figure 3:
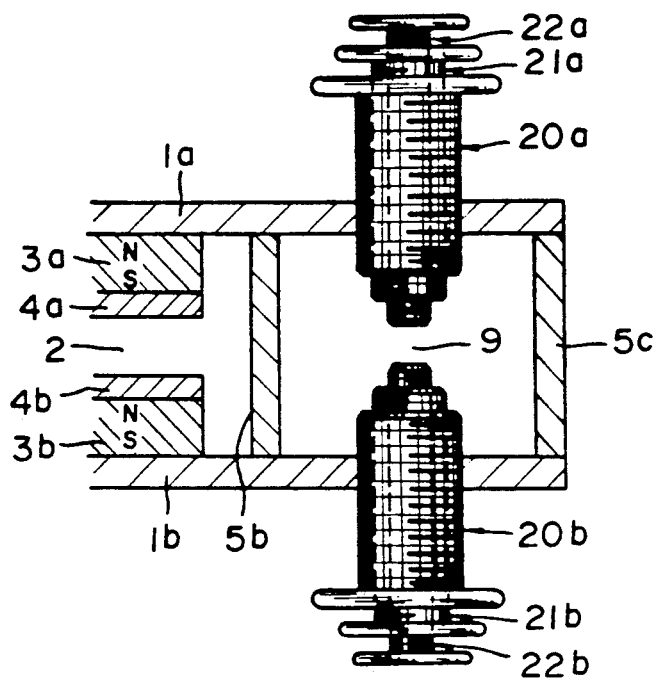
FIG. 3 is a side elevational view, partially in vertical section, of one embodiment of a magnetic field generating device for use with an ESR system according to the present invention.

Also in a constitution shown in FIG. 3, a magnetic field which is uniform and varies over a wide range can be formed in a space between permanent magnets by disposing a plurality pair of movable yokes to a pair of yokes so as to be brought closer and apart from each other in symmetry with the central plane of the space.

Figure 4:
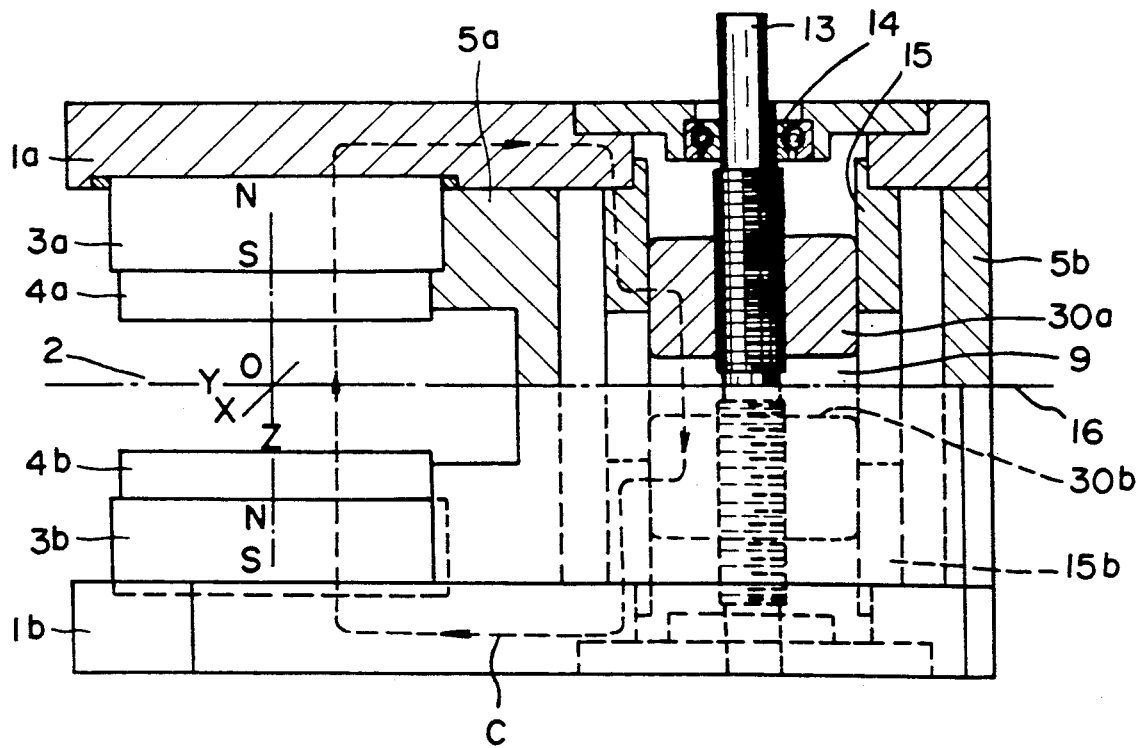
FIG. 4 is a side elevational view, partially in vertical section, of one embodiment of a magnetic field generating device for an ESR system according to the present invention.

The method of continuously varying the distance between the opposing surface of the movable yokes can be attained by a constitution, as shown in FIGS. 1, 2 and 3, in which movable yokes are disposed coaxially or at a predetermined position in perpendicular to the central plane of the space and an opposing distance between the movable yokes is changed by the rotation of a bolt, or a constitution as shown in FIG. 4, in which a bolt is attached in perpendicular to the central gap plane and threads are formed in the directions opposite to each other in upper and lower portion with respect to the central plane of a space as the boundary and a pair of movable yokes are screw-coupled thereto and the bolt is rotated to vary the opposing distance between the movable yokes. In addition, so long as the distance between the opposing surface of the movable yokes can be changed to continuously vary the magnetic resistance in the magnetic path, the shape, etc. of the movable yokes can optionally be selected and, further, any known moving means such as a rack-pinion, hydraulic piston and slide mechanism may be employed.

When the distance between the opposing surfaces of the movable yokes is changed, magnetic field in the space to which the permanent magnets are opposed can be varied continuously, but it is desirable to take the following points into consideration in order to linearly vary the magnetic field in the space while maintaining at a high accuracy less than ±1 G.

That is, the change in the distance between the opposing surface of a pair of movable yokes is not always in a proportional relationship with the change of the magnetic field in the space, and for varying the magnetic field at a desired accuracy, it is desirable to detect the distance between the opposing surfaces and the magnetic field intensity by means of known measuring means and control the closing or aparting movement of a pair of movable yokes based on the detected values.

The present inventors further provide the following constitution for improving the operationability.

For the application use to ESR system, it is necessary to linearly vary the magnetic field within a range of about ±100 G. However, if such a change in the magnetic field is intended to be attained only by the moving control of the movable yokes, there is a worry that the operational control for the movable yoke is troublesome and the entire device is complicated and becomes expensive for attaining such a constitution capable of easy operation.

In view of the above in the present invention, improvement for the operationability has been attained by a constitution in which a solenoid coil is disposed around the movable yoke.

That is, by generating a predetermined high magnetic field in a space between opposing surfaces of movable yokes while controlling the distance therebetween and then supplying a predetermined DC current to a solenoid coil while possessing the set distance between the opposing surfaces to a constituent level, it is possible to maintain the magnetic field at a high accuracy of less than ±1 G without changing the magnetic field of distribution in the space and linearly vary the magnetic field, for example, within a range of ±100 G.

In this embodiment, the solenoid disposed around the movable yoke merely conducts variation of magnetic field of about ±100 G, which does not hinder the size reduction of the device so much.

Further, since the solenoid is disposed apart from the permanent magnet, there is no worry that undesirable effects due to the heat generation of the solenoid are given on the permanent magnet (for example, change of the magnetic field intensity along with the change of the temperature of the permanent magnet, making the degree of uniformity of the magnetic field instable).

The present invention is described more specifically referring to the drawings.

EMBODIMENT 1

A pair of plate-like stationary yokes 1a and 1b shown in FIG. 1 are arranged opposite to each other through supports 5a, 5b and 5c made of non-magnetic material so as to form a required space 2 between a pair of permanent magnets 3a and 3b.

That is, the disk-like permanent magnets 3a and 3b are attached to the opposing surfaces of the plate-like stationary yokes 1a and 1b with their magnetic poles reversed and magnetic pole pieces 4a and 4b are fixed to the opposing surfaces of the magnets leaving a desired space therebetween.

A coarsely movable yoke 6 of large diameter is disposed to the upper stationary yoke 1a. That is, the coarsely movable yoke 6 is made of a screwed bolt having threads formed at a required pitch to the outer circumferential surface and screw-threaded into a hole of the stationary yoke 1a.

Further, to the coarsely movable yoke 6, there is coaxially screw-threaded a finely movable yoke 7 made of a bolt member of small diameter having threads formed at a finer pitch.

In this embodiment the coarsely movable yoke 6 and the finely movable yoke 7 constitute a movable yoke.

When a handle 6a disposed at the top of the coarsely movable yoke 6 is rotated, the coarsely movable yoke 6 can be moved continuously in the vertical direction. In the same way, when a handle 6a, of the finely movable yoke 7 is rotated, the finely movable yoke 7 can be moved continuously.

Further, to the upper surface of the lower stationary yoke 1b, there is attached a fixed yoke 8 in opposite relationship with the coarsely movable yoke 6 and finely movable yoke 7 leaving a gap 8 therebetween.

OPERATION

With the above-described arrangement shown in FIG. 1, there is formed, in the magnetic field generating device for an ESR system, a magnetic path shown by the broken line (B) and, when the coarsely movable yoke 6 is moved forward and backward, the opposing distance between the coarsely movable yoke 6 and the fixed yoke 8, that is, the gap 9 can change continuously so that the intensity of the magnetic field formed in the space 2 between the magnetic pole pieces 4a and 4b can be varied continously.

That is, when the distance between the coarsely movable yoke 6 and the stationary yoke 8 is made larger, the intensity of the magnetic field in the space 2 becomes weak and vice versa.

By setting a required opposing distance between the coarsely movable yoke 6 and the fixed yoke 8 and then moving the finely movable yoke 7 of finer screw pitch forward and backward, the opposing distance with respect to the stationary yoke 8 can properly be selected to increase or decrease the intensity of the magnetic field in the space 2 finely by each step.

Accordingly, the change of the magnetic field intensity in the space 2 can be quantitatively recognized in accordance with the number of rotation for each of the coarsely movable yoke 6 and the finely movably yoke 7.

EMBODIMENT 2

In the magnetic field generating device for an ESR system shown in FIG. 2, movable yokes 10, 11, 12 comprising three bolt members are disposed substantially in the same constitution as that of the magnetic circuit described above in FIG. 1.

Three movable yokes 10, 11 and 12 of large, medium and small diameters are respectively disposed in parallel to the upper stationary yoke 1a. That is, each of the movable yokes has threads formed at a finer pitch to the outer circumferential surface thereof for the bolt of finer diameter and screw-threaded into the hole of the stationary yoke 1a.

Further, three fixed yokes 8 are attached at the upper surface of the lower stationary yoke 1b and they are disposed in opposite relationship with the three movable yokes 10, 11 and 12 of large, medium and small diameter respectively leaving a gap 9 therebetween.

When each of handles 10a, 11a, 12a disposed at the top end for each of the movable yokes 10, 11 and 12 is rotated, each of the movable yokes can be moved continuously in the vertical direction to adjust the opposing distance with respect to the fixed yoke 8 individually.

OPERATION

With the above-described arrangement, in the same manner as the magnetic field generating device for an ESR system shown in FIG. 1, the gap 9 between the movable yokes 10, 11 and 12 and the fixed yoke 8 can be changed continuously so that the intensity of the magnetic field formed in the space 2 by the magnetic pole pieces 4a and 4b can be varied continuously.

For example, the opposing distance between the movable yoke 12 of small diameter and the fixed yoke 8 is set to a predetermined or certain value. Then, by setting a required opposing distance between the movable yoke 10 of great diameter and the fixed yoke 8 and then setting the opposing distance between the movable yoke 11 of medium diameter and the stationary yoke 8 to a further narrow value, the magnetic field intensity in the space 2 can be set to a required value at high accuracy.

Further, by forwarding and backwarding the movable yoke 12 of small diameter by screw-coupling, the magnetic field intensity set to a required value at high accuracy in the space 2 can be increased or decreased by a fine step, so that the change of the magnetic field intensity from the required value can quantitatively be recognized as the number of rotation for the movable yoke 12 of small diameter.

EMBODIMENT 3

FIG. 3 shows an embodiment of a magnetic field generating device for an ESR system, in which movable yokes comprising three pair of bolt members are coaxially screw-threaded substantially in the same constitution as the magnetic circuit as described shown in FIG. 1.

Three movable yokes 20a, 21a and 22a of large diameter, medium diameter and small diameter are coaxially screw-threaded to an upper stationary yoke 1a. That is, each of the movable yokes has threads formed at a finer pitch to the outer circumferential surface thereof for the bolt of smaller diameter, in which the movable yoke 21a of medium diameter is screw-threaded into the movable yoke 20a of large diameter screw-threaded into a hole of a stationary yoke 1a and the movable yoke 22a of small diameter is screw-threaded into the movable yoke 21a of medium diameter respectively.

On the other hand, in the same manner, three movable yokes 20b, 21b and 22b of large diameter, medium diameter and small diameter are also coaxially screw-threaded to the lower stationary yoke 1b, and the three pairs of the movable yokes 20a, 20b; 21a, 21b; 22a, 22b are disposed in opposite relationship with a yoke gap of an equal distance relative to the central gap plane passing through the space 2.

When a handle disposed at the top of each of the movable yokes 20a, 20b; 21a, 21b; 22a, 22b; is rotated, each of the yokes can be moved continuously in the vertical direction so that the opposing distance to each of the paired yokes can be adjusted individually.

OPERATION

A magnetic path is formed in the embodiment detailed in FIG. 3.

In this case, when a pair of movable yokes 20a and 20b of large diameter are moved forward and backward by the same number of rotation, the opposing distance between the pair of the movable yokes 20a and 20b, that is, the yoke gap of an equal distance relative to the central gap plane passing through the space 2 can be changed continuously to vary the intensity of the magnetic field formed in the space 2 by the magnetic pole pieces 4a, 4b continuously.

For example, the yoke gap between a pair of movable yokes 22a and 22b of small diameter is set to a certain value. Then, after setting the opposing distance between a pair of the movable yokes 20a and 20b of large diameter and then setting a required further narrow opposing distance between a pair of movable yokes 21a and 21b of medium diameter, the intensity of the magnetic field in the space 2 can be set to a required value at high accuracy.

Further, when a pair of movable yokes 22a and 22b of small diameter are moved forward and backward, the intensity of the magnetic field set to a required value at high accuracy in the space 2 can be increased or decreased by a fine step and the change of the magnetic field intensity from a required value can be recognized quantitatively by the number of rotations for the movable yokes 22a and 22b of small diameter.

EMBODIMENT 4

In each of the embodiments shown in FIGS. 1, 2 and 3, a plurality of movable yokes are used thereby enabling the magnetic field intensity in the space to be increased or decreased by a fine step but this makes the structure of the movable yokes somewhat complicate.

In the embodiment shown in FIG. 4, the structure of the movable yokes is simplified and the operationability of the movable yokes is improved.

A pair of plate-like stationary yokes 1a and 1b shown in FIG. 4 are arranged opposite to each other through supports 5a and 5b made of a non-magnetic material so as to form a required space 2 between a pair of permanent magnets 3a and 3b.

That is, the disk-like permanent magnets 3a and 3b are attached to the opposite surfaces of the plate-like stationary yokes 1a and 1b with their magnetic poles reversed and magnetic pole pieces 4a and 4b are fixed to the opposing surfaces of the magnets while leaving the desired space 2 therebetween.

To the pair of plate-like stationary yokes 1a and 1b, holes are disposed between the supports 5a and 5b respectively, and a shaft 13 rotatably supported by a shaft bearing 14 in the holes is disposed in perpendicular to the central gap plane 16 passing through the space 2.

The shaft 13 has threads formed at the outer circumferential surface in the directions vertically opposed to each other with respect to the central space plane 16 as a boundary and a pair of upper and lower disk-like movable yokes 30a and 30b are screw-threaded to the thread portions.

Further, each of the movable yokes 30a and 30b are fit into each of sleeves 15a and 15b made of magnetic material and coaxially disposed with the shaft 13 between the plate-like stationary yokes 1a and 1b, so that a pair of movable yokes 30a and 30b move slidably along with the rotation of the shaft 13 and are brought closer and apart from each other with respect to the central space plane 16 depending on the rotating direction.

OPERATION

With the above-described arrangement shown in FIG. 4, in the magnetic field generating device for an ESR system, there is formed a magnetic path shown by a broken line C, that is, a magnetic path in which magnetic fluxes flow from the permanent magnet 3a, plate-like stationary yoke 1a, sleeve 15a, movable yoke 30a, yoke gap 9, movable yoke 30b, sleeve 15b, plate-like stationary yoke 1b, permanent magnet 3b, magnetic pole piece 4b, space 2 and magnetic pole piece 4a.

Then, when a pair of movable yokes 30a and 30b are moved forward and backward, that is, brought closer or apart with each other by the rotation of the shaft 13, the opposing distance between a pair of movable yokes 30a and 30b, that is, the yoke gap 9 can change continuously to vary the intensity of the magnetic field formed in the space 2 between the magnetic pole pieces 4a and 4b continuously.

That is, when the distance between the pair of the movable yokes 30a and 30b is made larger, the intensity of the magnetic field in the space 2 becomes weak and vice versa.

FIG. 5 through FIG. 9 show embodiments of the magnetic field generating system for use in an ESR device in which a solenoid coil is disposed around a movable yoke.

Figure 5:
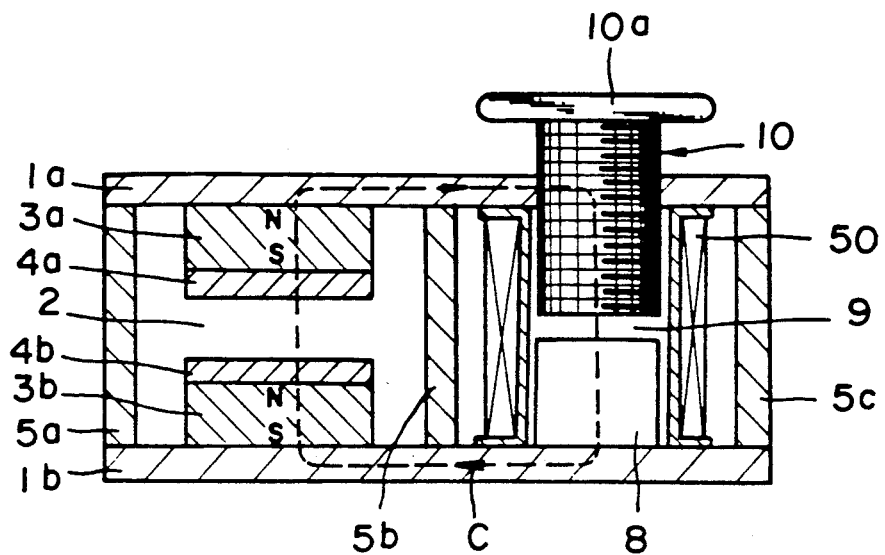
FIG. 5 is a vertical sectional view of one embodiment of a magnetic field generating device for an ESR system according to the present invention.

FIG. 5 shows an embodiment of the present invention in which a solenoid coil 50 is disposed further to the magnetic field generating device for use with an ESR device proposed previously by the present applicant, to remarkably improve the operationability.

Figure 6:
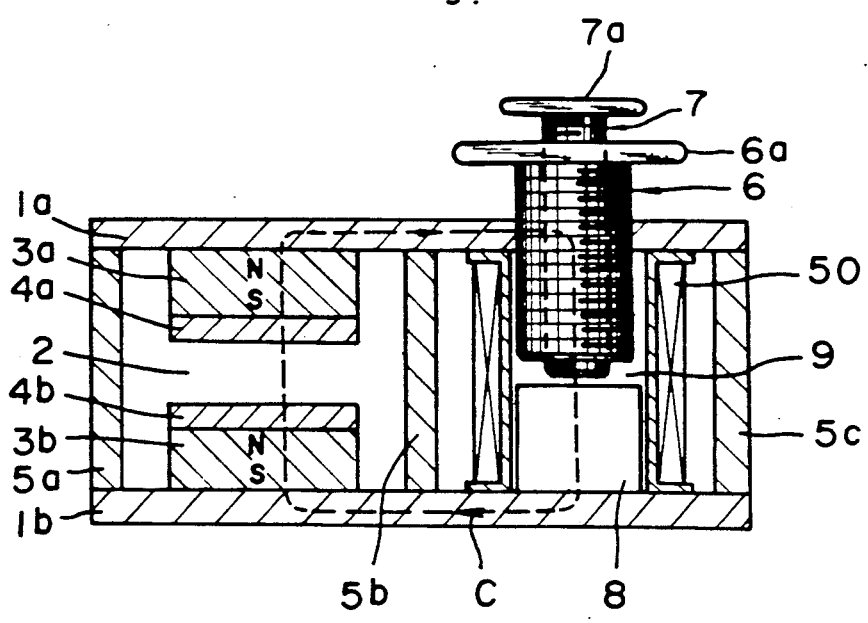
FIG. 6 is a vertical sectional view of one embodiment of a magnetic field generating device for an ESR system according to the present invention.

FIG. 6 shows an embodiment in which a solenoid coil 50 is disposed around the coarsely movable yoke 6 and the stationary yoke 8 in the embodiment shown in FIG. 1.

Figure 7:
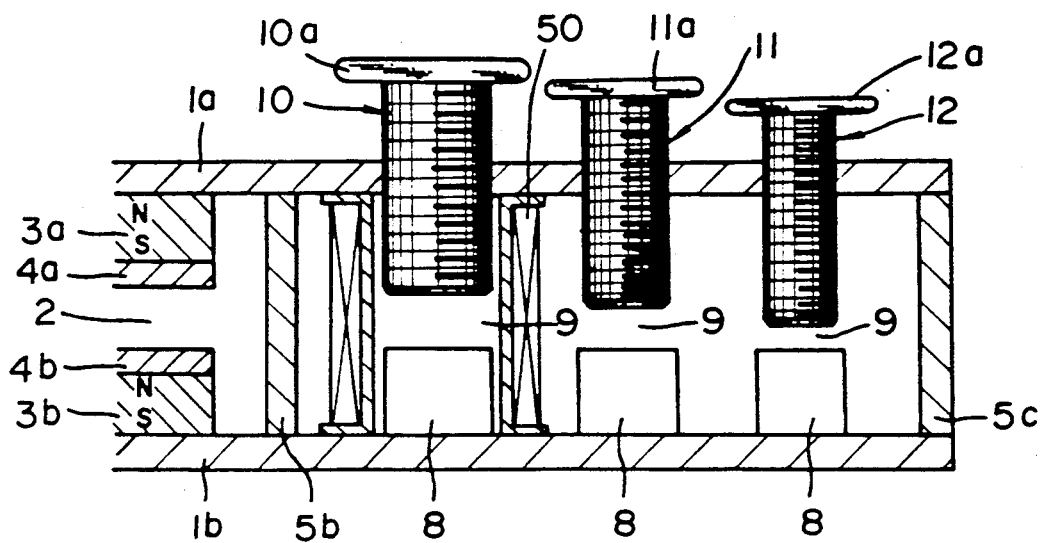
FIG. 7 is a side elevational view, partially in vertical section, of one embodiment of a magnetic field generating device for an ESR system according to the present invention.

FIG. 7 shows an embodiment in which a solenoid coil 50 is disposed around the movable yoke 10 of large diameter among the movable yokes 10, 11 and 12 and the stationary yoke 8 in the embodiment shown in FIG. 2.

Figure 8:
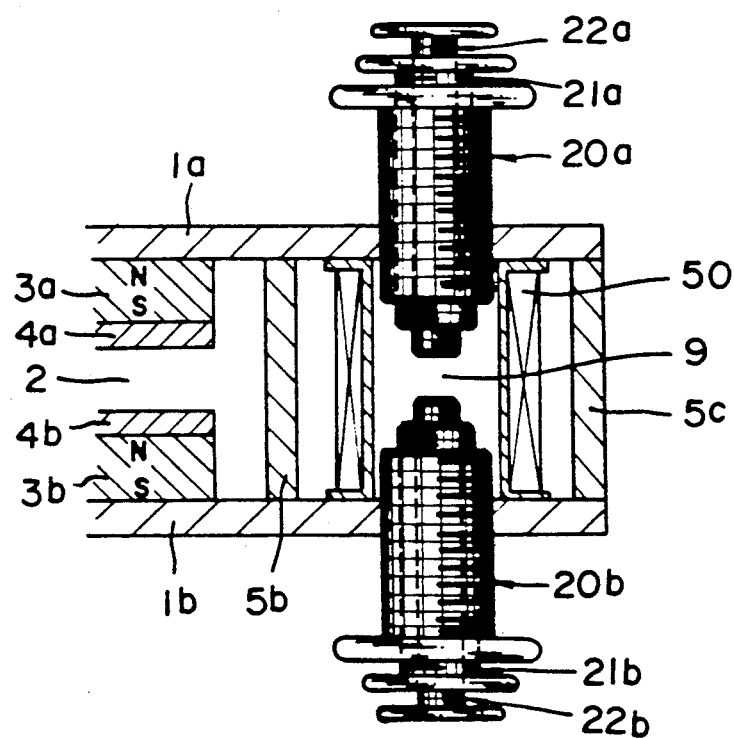
FIG. 8 is a side elevational view, partially in vertical section, of one embodiment of a magnetic field generating device for an ESR system according to the present invention.

FIG. 8 shows an embodiment in which a solenoid coil 50 is disposed around the movable yokes 20a and 20b of large diameter in the embodiment shown in FIG. 3.

Figure 9:
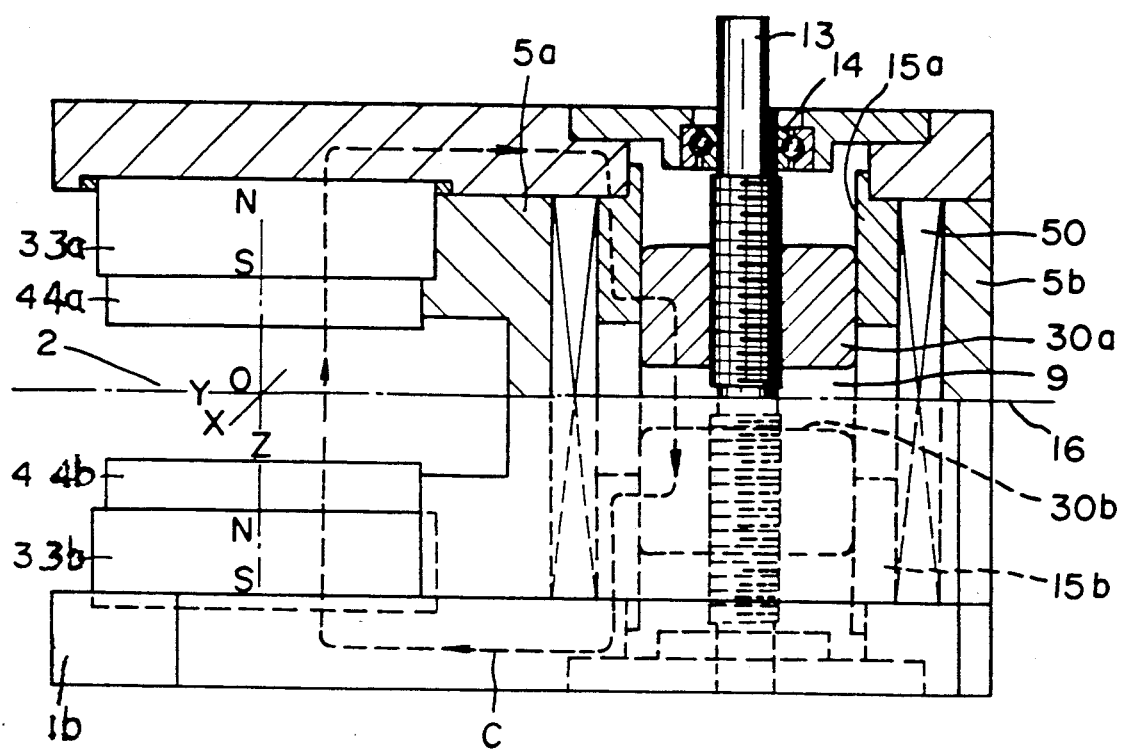
FIG. 9 is a side elevational view, partially in vertical section, of one embodiment of a magnetic field generating device for an ESR system according to the present invention, FIG. 10(a) and (b) are vertical cross sectional view and a plan view of one embodiment for a magnetic pole piece in a magnetic field generating device for an ESR system according to the present invention, FIG. 11(a) and (b) are vertical cross sectional view and a plane view of one embodiment for a magnetic pole piece in a magnetic field generating device for an ESR system according to the present invention.

FIG. 9 shows an embodiment in which a solenoid coil 50 is disposed by way of the sleeves 15a and 15b around the movable yokes 30a and 30b in the embodiment shown in FIG. 4.

In each of the figures, the solenoid coil 50 is shown to be disposed around the entire movable yokes. However, the disposition of the coil is not necessarily limited only to those embodiments shown in the drawings and any embodiment can be employed so long as a weak magnetic field can be superimposed through the movable yoke to the space 2. The position, etc. of the coil are selected depending on the capacity of DC current applied, wire diameter and number of turn of coils, disposition and shape of the movable yoke, etc.

In the embodiments shown in FIG. 5 through FIG. 9, a magnetic field of uniform intensity, for example, of about 3500 gausses is generated in the space by adjusting the opposing distance between the movable yokes. Then, by applying a DC current to the solenoid coil 50 to superimpose a weak magnetic field of about ±100 G over the magnetic field in the space 2, the weak magnetic field can be varied continuously, so that the magnetic field intensity can stably be varied linearly while maintaining the high degree of uniformity for the magnetic field intensity in the space 2.

As shown in FIG. 1 through FIG. 9, in the device according to the present invention, the magnetic field in the space between the opposing permanent magnets can be varied continuously by changing the distance between a movable yoke and a stationary yoke or fixed yoke or the opposing distance between a pair of movable yokes. Particularly, since the size of the space is between the opposing magnetic poles to which the object to be measured is set, it has a merit capable of stably unifying magnetic field.

EXAMPLE 1

A magnetic field generating device for an ESR system shown in FIG. 1 was used in which a coarsely movable screwed bolt of 20 mm $\phi$ and finely movable screwed bolt of 7 mm $\phi$ were arranged coaxially. A magnetic field intensity in the space was measured while changing the opposing distance between the movable yoke and the stationary yoke, and the result is shown in FIG. 12 as a relationship of the number of rotation for the coarsely movable screwed bolt and the finely movable screwed bolt to a magnetic field intensity Bg.

A curve plotted by symbols "o" shows the relationship between the number of rotation for the coarsely movable screwed bolt and the change of the magnetic field intensity, and a curve plotted by symbols "x" shows that for the finely movable screwed, obtained by rotating and then fixing the coarsely movable screwed bolt at a position and then further rotating the finely movable screwed bolt. ¼, ¾, 5/4, 7/7 and 9/4 attached to the solid line plotted with "x" show the number of rotation for the coarsely movable screwed bolt.

Figure 12:
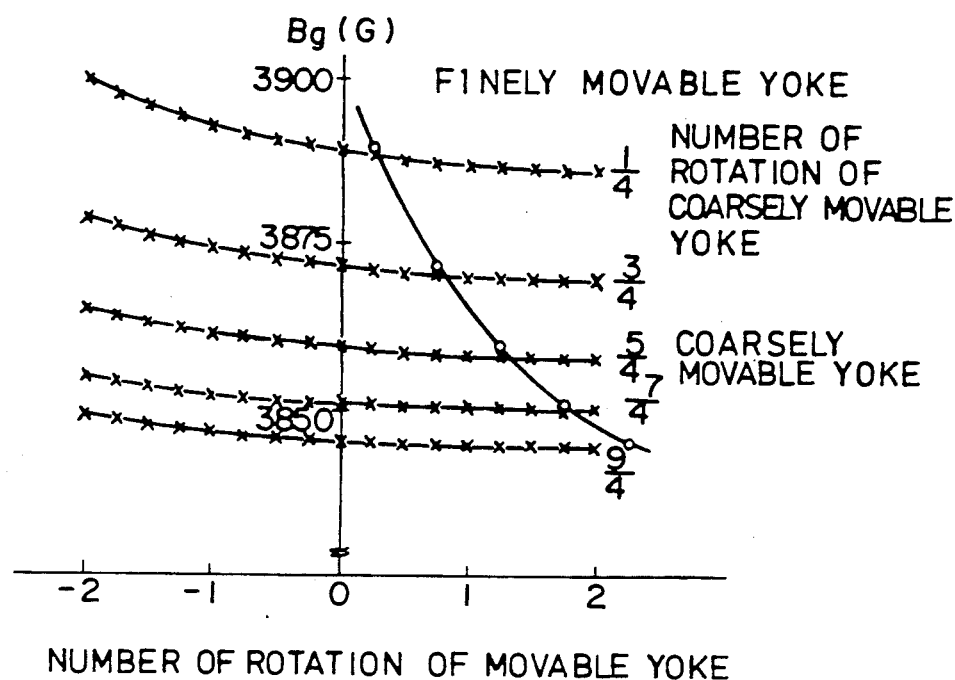
FIG. 12 is a graph showing the change of magnetic field in a space for illustrating the function of movable yokes in a magnetic field generating device for an ESR system shown in FIG. 1.

As apparent from FIG. 12, while one turn of the coarsely movable screwed bolt corresponds to the change of the magnetic field intensity of about 25 G, one turn of the finely movable screwed bolt corresponds to about 2 G and, thus, the variation coefficient for the magnetic field intensity relative to the number of rotation is extremely small.

Accordingly, by the combination of the number of rotation for the coarsely movable screwed bolt and the finely movable screwed bolt, the magnetic field in the space can optionally be changed at an accuracy less than 1 G.

In the ESR measurement, since the range for the absorption lines of signals is about 1 G, it is necessary that the change of the magnetic field be moderated and the value has to be determined at an accuracy from the order of 1 G to 0.1 G.

As apparent from the foregoing embodiment, the magnetic field generating device according to the present invention can sufficiently satisfy such a measuring accuracy and, thus, an ESR system with the magnetic field generating device using permanents magnet can be developed.

EXAMPLE 2

Figure 13:
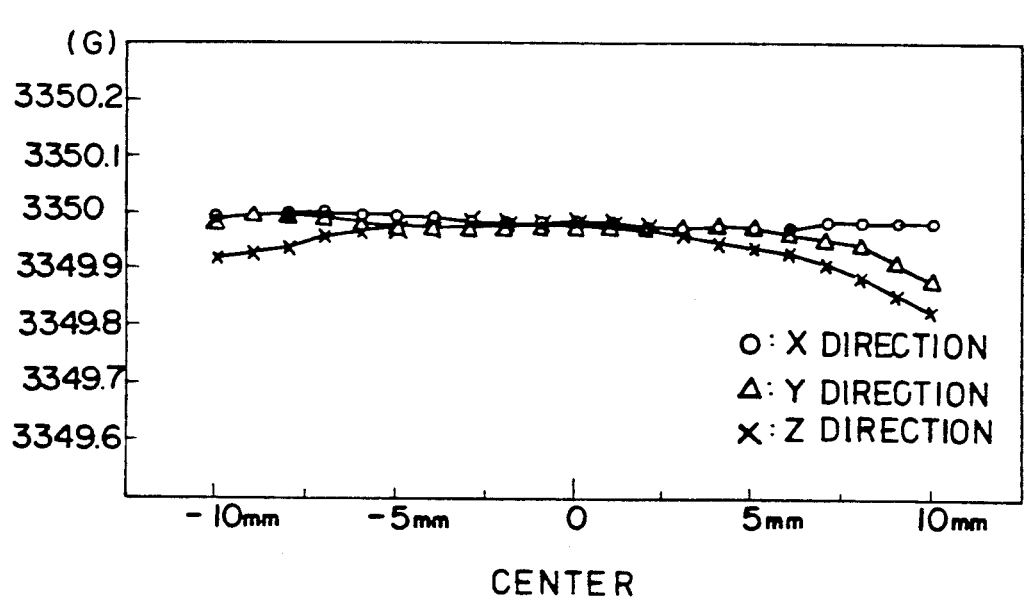
FIG. 13 is a graph showing the distribution of magnetic field in a space for illustrating the function of movable yokes in a magnetic field generating device for an ESR system shown in FIG. 9.

The magnetic field generating device for ESR system shown in FIG. 9 was used and the opposing distance between the movable yokes 30a and 30b was adjusted for the aimed value of the magnetic field intensity of 3350 G in the space 2. Then, when the magnetic field intensity in the space 2 was measured, a high degree of uniformity could be obtained at 20 ppm within a circle with radius of 5 mm around the center of the space 2 as shown in FIG. 13.

Further, when a DC current was applied to the solenoid coil 50 to superimpose a magnetic field of about ±100 G over the magnetic field in the space 8, high degree of uniformity of the magnetic field intensity in the space 2 did not change.

Figure 14:
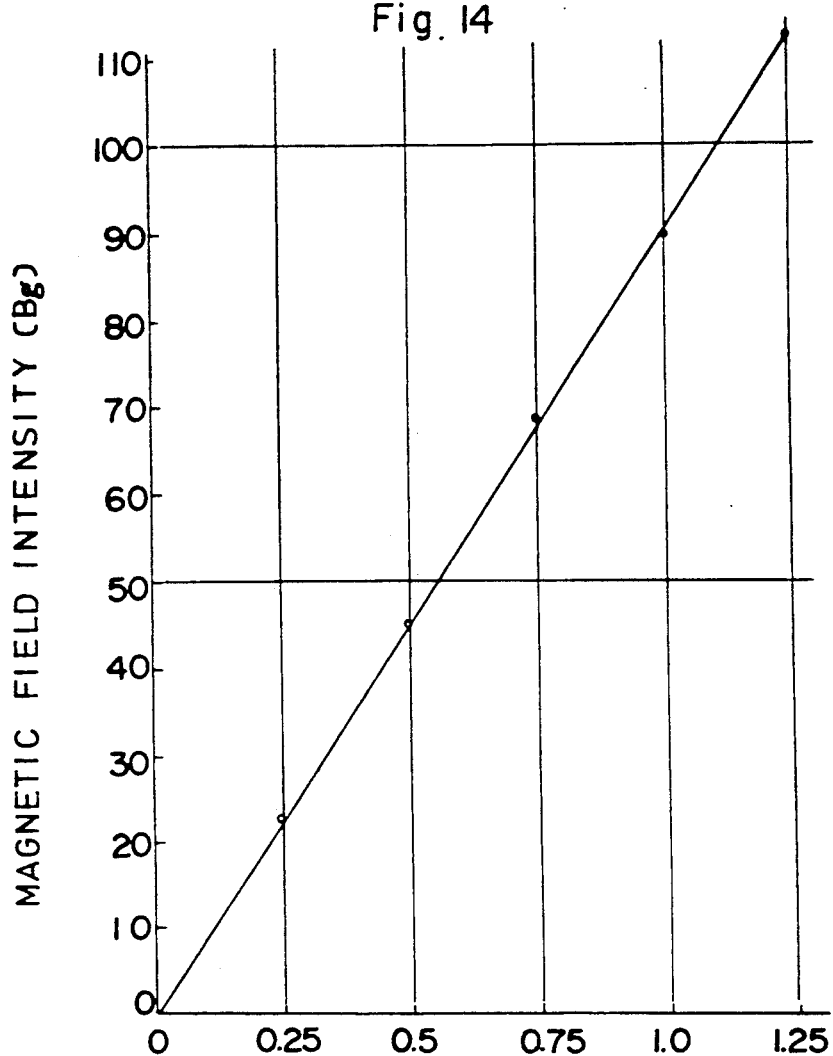
FIG. 14 is a graph showing the change of magnetic field in a space for illustrating the function of solenoid coil in a magnetic field generating device for an ESR system shown in FIG. 9.
Figure 15:
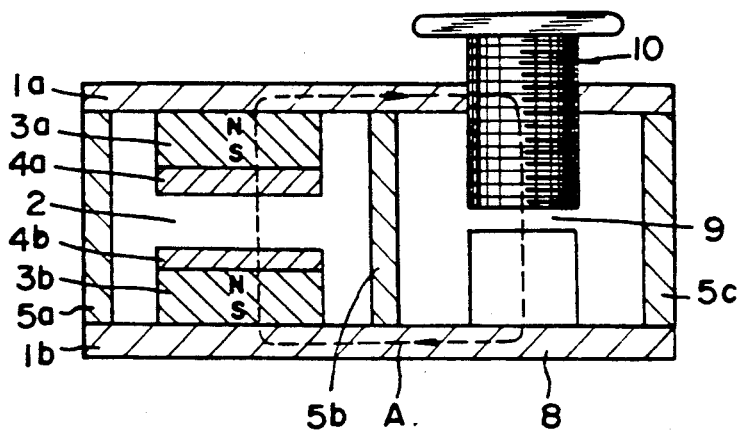
FIG. 15 is a vertical cross sectional view of a magnetic field generating device for an ESR system proposed previously by the present applicant.

FIG. 14 shows a relationship between the DC current applied to the solenoid coil 50 and the change of the magnetic field intensity (Bg) in the space 2. It can be confirmed also from the graph that the magnetic field intensity can be stably varied linearly by the device according to the present invention.

What is claimed is:

1. A magnetic field generating device for an ESR system, comprising a magnetic field generating portion and a magnetic resistance changing portion, said magnetic field generating portion comprising permanent magnets fixed respectively to the inner surfaces of a pair of plate-like yokes arranged in opposing and spaced apart relationship with each other, and magnetic pole pieces fixed respectively to the opposing surfaces of said permanent magnets to form an air gap between said magnetic pole pieces, and said magnetic resistance changing portion being aligned with said magnetic field generating portion and composed of a plurality of independently movable yokes provided on either one of said paired plate-like yokes and a stationary yoke arranged on another of said paired plate-like yokes to be opposite to said movable yokes, wherein an opposing distance between said movable yokes and said stationary yoke is changed to continuously change the magnetic resistance of a magnetic path formed by said permanent magnets, plate-like yokes, movable yokes and stationary yoke, thereby continuously changing the magnetic field intensity in said air gap of said magnetic field generating portion.

2. A magnetic field generating device for an ESR system, comprising a magnetic field generating portion and a magnetic resistance changing portion, said magnetic field generating portion comprising permanent magnets fixed respectively to the inner surfaces of a pair of plate-like yokes arranged in opposing and spaced apart relationship with each other, and magnetic pole pieces fixed respectively to the opposing surfaces of said permanent magnets to form an air gap between said magnetic pole pieces, and said magnetic resistance changing portion being aligned with said magnetic field generating portion and composed of a plurality of independently movable yokes provided respectively on said paired plate-like yokes to be movable to come close to and go away from each other symmetrically with respect to a center plane of the space, wherein an opposing distance between said movable yokes is changed to continuously change the magnetic resistance of the magnetic path formed by said permanent magnets, plate-like yokes and movable yokes, thereby continuously changing the magnetic field intensity in said air gap of said magnetic field generating portion.

3. A magnetic field generating device for an ESR system according to claim 1, wherein an annular protrusion having a trapezoidal cross section is disposed at the periphery of the magnetic pole piece.

4. A magnetic field generating device for an ESR system according to claim 1, wherein a plurality of movably yokes comprise bolt members moving forward and backward in a screw-coupling passing through the stationary yoke.

5. A magnetic field generating device for an ESR system according to claim 1, wherein a plurality of movable yokes are arranged coaxially.

6. A magnetic field generating device for an ESR system according to claim 5, wherein the movable yoke comprises a coarsely moved screwed bolt of large diameter and finely movable screwed bolt of small diameter.

7. A magnetic field generating device for an ESR system according to claim 4, wherein a plurality of movable yokes are disposed in parallel.

8. A magnetic field generating device for an ESR system according to claim 7, wherein movable yokes have diameter different from each other.

9. A magnetic field generating device for an ESR system, comprising a magnetic field generating portion and a magnetic resistance changing portion, said magnetic field generating portion comprising permanent magnets fixed respectively to the inner surfaces of a pair of plate-like yokes arranged in opposing and spaced apart relationship with each other, and magnetic pole pieces fixed respectively to the opposing surfaces of said permanent magnets to form an air gap between said magnetic pole pieces, and said magnetic resistance changing portion being aligned with said magnetic field generating portion and composed of a plurality of paired movable yokes provided respectively in said paired plate-like yokes, wherein said paired movable yokes are individually movable to change an opposing distance between said paired movable yokes respectively, thereby continuously changing the magnetic resistance of the magnetic path formed by said permanent magnets, plate-like yokes and paired movable yokes to continuously change the magnetic field intensity in said air gap of said magnetic generating portion.

10. A magnetic field generating device for an ESR system according to claim 1, wherein each of a pair of permanent magnets comprises a permanent magnet made of rare earth element.

11. A magnetic field generating device for an ESR system according to claim 1, wherein a solenoid coil is disposed around the movable yoke.

12. A magnetic field generating device for an ESR system according to claim 2, wherein an annular protrusion having a trapezoidal cross section is disposed at the periphery of the magnetic pole piece.

13. A magnetic field generating device for an ESR system according to claim 2, wherein a pair of movable yokes are screw-coupled to a shaft disposed between a pair of stationary yokes and having upper and lower portions formed at the outer circumference threaded in the direction opposite to each other with the central plane of the space as a boundary, and each fitted into a sleeve made of magnetic material and coaxially disposed with the shaft so that they move slidingly along with the rotation of the shaft.

14. A magnetic field generating device for an ESR system according to claim 2, wherein a pair of magnets comprises a permanent magnet made of the rare earth element.

15. A magnetic field generating device for an ESR system according to claim 2, wherein a solenoid is disposed around the movable yoke.

16. A magnetic field generating device for an ESR system according to claim 9, wherein an annular protrusion having a trapezoidal cross section is disposed at the periphery of the magnetic pole piece.

17. A magnetic field generating device for an ESR system according to claim 9, wherein a plurality pairs of movable yokes comprises a bolt member moving forward and backward is a screw-coupling passing through the stationary yoke.

18. A magnetic field generating device for an ESR system according to claim 17, wherein a plurality of movable yokes are disposed coaxially.

19. A magnetic field generating device for an ESR system according to claim 18, wherein the movable yoke comprises a coarsely movable screwed bolt of large diameter and finely movable screwed bolt of small diameter.

20. A magnetic field generating device for an ESR system according to claim 17, wherein a plurality of movable yokes are disposed in parallel.

21. A magnetic field generating device for an ESR system according to claim 20, wherein movable yokes have diameter different from each other.

22. A magnetic field generating device for an ESR system according to claim 9, wherein each of a pair of permanent magnets comprises a permanent magnet made of rare earth element.

23. A magnetic field generating device for an ESR system according to claim 9, wherein a solenoid coil is disposed around the movable yoke.

24. A magnetic field generating device for an ESR system, comprising a magnetic field generating portion and a magnetic resistance changing portion, said magnetic field generating portion comprising permanent magnets fixed respectively to the inner surfaces of a pair of plate-like yokes arranged in opposing and spaced apart relationship with each other, and magnetic pole pieces fixed respectively to the opposing surfaces of said permanent magnets to form an air gap between said magnetic pole pieces, and said magnetic resistance changing portion being aligned with said magnetic field generating portion and composed of a plurality of independently movable yokes provided on either one of said paired plate-like yokes and a stationary yoke arranged on another of said paired plate-like yokes to be opposite to said movable yokes, said stationary yoke and one of said movable yokes being encircled with a solenoid coil, wherein an opposing distance between said movable yokes and said stationary yoke is changed to continuously change the magnetic resistance of the magnetic path formed by said permanent magnets, plate-like yokes, movable yokes and stationary yoke, thereby continuously changing the magnetic field intensity in said air gap of said magnetic field generating portion.

25. A magnetic field generating device for an ESR system, comprising a magnetic field generating portion and a magnetic resistance changing portion, said magnetic field generating portion comprising permanent magnets fixed respectively to the inner surfaces of a pair of plate-like yokes arranged in opposing and spaced apart relationship with each other, and magnetic pole pieces fixed respectively to the opposing surfaces of said permanent magnets to form an air gap between said magnetic pole pieces, and said magnetic resistance changing portion being aligned with said magnetic field generating portion and composed of a pair of movable yokes provided respectively in said paired plate-like yokes, wherein an opposing distance between said movable yokes is changed and a solenoid coil is disposed to encircle said movable yokes to continuously change the magnetic resistance of the magnetic path formed by said permanent magnets, plate-like yokes and paired movable yokes, thereby continuously changing the magnetic field intensity in said air gap of said magnetic field generating portion.

26. A magnetic field generating device for an ESR system according to claim 24, wherein an annular protrusion having a trapezoidal cross section is disposed at the periphery of the magnetic pole pieces.

27. A magnetic field generating device for an ESR system according to claim 24, wherein a plurality of movable yokes for continuously changing the distance between opposing surfaces of the stationary yokes are arranged to at least one of said pair of yokes so that they are moved individually thereby enabling the magnetic resistance of a magnetic path formed by said permanent magnets, stationary yokes and movable yokes to vary continuously.

28. A magnetic field generating device for an ESR system according to claim 24, wherein each of said pair of permanent magnets comprises a permanent magnet made of rare earth element.

29. A magnetic field generating device for an ESR system according to claim 9, wherein a plurality of said paired movable yokes are movable to come close to and away from each other symmetrically with respect to a center plane of the space.

* * * * *